(12) United States Patent
Alexander

(10) Patent No.: US 6,326,986 B1
(45) Date of Patent: *Dec. 4, 2001

(54) SYSTEM AND METHOD FOR GRAPHICALLY MANIPULATING DISPLAY ELEMENTS IN A COMPUTER-BASED SYSTEM

(75) Inventor: Jay A Alexander, Monument, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/379,998

(22) Filed: Aug. 24, 1999

Related U.S. Application Data

(63) Continuation of application No. 08/863,994, filed on May 27, 1997, now Pat. No. 6,054,984.

(51) Int. Cl.[7] .................................................... G06F 15/00
(52) U.S. Cl. .......................................... 345/764; 345/970
(58) Field of Search .................................... 345/339, 340, 345/349, 440, 134, 970

(56) References Cited

U.S. PATENT DOCUMENTS

| | | |
|---|---|---|
| 5,365,254 | 11/1994 | Kawamoto . |
| 5,553,213 | 9/1996 | Sano . |
| 5,579,467 | 11/1996 | Barber et al. . |
| 5,630,164 | 5/1997 | Williams et al. . |
| 5,631,667 | 5/1997 | Cadwell . |
| 5,757,371 | 5/1998 | Oran et al. . |
| 5,760,785 | 6/1998 | Barber et al. . |
| 6,054,984 | * 4/2000 | Alexander .......................... 345/440 |

OTHER PUBLICATIONS

Waveform Generator/Editor Software from R4 No Supports Pragmatic Arbitrary Waveform Generators, 1992.

Romanchik, Dan, "Virtual Instruments Meet Custom Test Needs", 1996.

* cited by examiner

Primary Examiner—Cao H. Nguyen

(57) ABSTRACT

A display element manipulation system and methodology for use in a computer-based system for providing a user with the ability to graphically manipulate a selected positionable display element presented on a display device. The display element manipulation system includes a display element selector configured to determine permissible adjustment directions for a selected positionable display element. The display element manipulation system also includes a display element position determinator configured to determine an adjustment command representing a desired adjustment direction and position for the selected display element.

40 Claims, 13 Drawing Sheets

FIG. 5A

| DRAG STATE | CONTROL ID | DRAG TYPE | SIGNAL ID |
|---|---|---|---|
| NOTHING | NULL_CTRL_ID | NONE | -1 |
| CHANNEL 1 | CHAN1_OFFSET_CTRL | VERT_REL | CH1A |
| CHANNEL 2 | CHAN2_OFFSET_CTRL | VERT_REL | CH2A |
| CHANNEL 3 | CHAN3_OFFSET_CTRL | VERT_REL | CH3A |
| CHANNEL 4 | CHAN4_OFFSET_CTRL | VERT_REL | CH4A |
| FUNCTION 1 | FN1_OFFSET_CTRL | VERT_REL | FN1 |
| FUNCTION 2 | FN2_OFFSET_CTRL | VERT_REL | FN2 |
| FUNCTION 3 | FN3_OFFSET_CTRL | VERT_REL | FN3 |
| FUNCTION 4 | FN4_OFFSET_CTRL | VERT_REL | FN4 |
| FUNC_1_POS | FN1_POSN_CTRL | HORZ_REL | FN1 |
| FUNC_2_POS | FN2_POSN_CTRL | HORZ_REL | FN2 |
| FUNC_3_POS | FN3_POSN_CTRL | HORZ_REL | FN3 |
| FUNC_4_POS | FN4_POSN_CTRL | HORZ_REL | FN4 |
| MEMORY_1 | MEM1_OFFSET_CTRL | VERT_REL | MEM1 |
| MEMORY_2 | MEM2_OFFSET_CTRL | VERT_REL | MEM2 |
| MEMORY_3 | MEM3_OFFSET_CTRL | VERT_REL | MEM3 |
| MEMORY_4 | MEM4_OFFSET_CTRL | VERT_REL | MEM4 |
| MEM_1_POS | MEM1_POSN_CTRL | HORZ_REL | MEM1 |
| MEM_2_POS | MEM2_POSN_CTRL | HORZ_REL | MEM2 |
| MEM_3_POS | MEM3_POSN_CTRL | HORZ_REL | MEM3 |
| MEM_4_POS | MEM4_POSN_CTRL | HORZ_REL | MEM4 |

DISPLAY ELEMENT MANIPULATION TABLE

FIG. 5B

| DRAG STATE | CONTROL ID | DRAG TYPE | SIGNAL ID |
|---|---|---|---|
| MARKER_X1 | X1_POSN_CTRL | HORZ_ABS | IDC_MARKER_X1Y1_SIGID |
| MARKER_X2 | X2_POSN_CTRL | HORZ_ABS | IDC_MARKER_X2Y2_SIGID |
| MARKER_Y1 | Y1_POSN_CTRL | HORZ_ABS | IDC_MARKER_X1Y1_SIGID |
| MARKER_Y2 | Y2_POSN_CTRL | HORZ_ABS | IDC_MARKER_X2Y2_SIGID |
| MARKER_T1 | TRIG1_LEVEL_CTRL | VERT_ABS | CH1A |
| MARKER_T2 | TRIG2_LEVEL_CTRL | VERT_ABS | CH2A |
| MARKER_T3 | TRIG3_LEVEL_CTRL | VERT_ABS | CH3A |
| MARKER_T4 | TRIG4_LEVEL_CTRL | VERT_ABS | CH4A |
| MARKER_T1S | SUPPL1_TRIG_LEVEL_CTRL | VERT_ABS | CH1A |
| MARKER_T2S | SUPPL2_TRIG_LEVEL_CTRL | VERT_ABS | CH2A |
| MARKER_T3S | SUPPL3_TRIG_LEVEL_CTRL | VERT_ABS | CH3A |
| MARKER_T4S | SUPPL4_TRIG_LEVEL_CTRL | VERT_ABS | CH4A |
| MAIN_POSN | MAIN_POS_CTRL | HORZ_REL | CH1A |
| DLYD_POSN | WINDOW_POS_CTRL | HORZ_REL | CH1A |

DISPLAY ELEMENT MANIPULATION TABLE

SYSTEM AND METHOD FOR GRAPHICALLY MANIPULATING DISPLAY ELEMENTS IN A COMPUTER-BASED SYSTEM

CROSS-REFERENCE TO RELATED APPLICATIONS

This is a continuation of application Ser. No. 08/863,994 filed on May 27, 1997 now U.S. Pat. No. 6,054,984 and naming as inventor Jay A. Alexander, hereby incorporated by reference herein in its entirety.

BACKGROUND OF THE INVENTION

1. Field of the Invention

The present invention relates generally to computer-based ystems and, more particularly, to graphically manipulating display elements in a computer-based system.

2. Related Art

A common technique for presenting information to users of computer-based systems is through use of a graphical user interface (GUI). A graphical user interface is typically part of an environment provided by an operating system executed by a processor in the computer system. Generally, the GUI is controlled by the operating system in response to commands provided by a user and application programs or other processes executing on or accessible to the computer-based system.

Common to virtually all conventional GUIs is the use of a mouse or other pointing device in a windowed environment. Windows are rectangular areas presented on a display that contain textual and/or graphical information related to the operation of the application program, operating system or other processes. Generally, additional display elements are provided by the GUI to facilitate interactions with the windows. These include, for example, menus, title bars, buttons, select boxes and icons. For a more detailed explanation of the operation of GUIs in general and Windows® in particular, see "Microsoft Windows version 3.1 User's Guide," and "Microsoft Windows 95 User's Guide," available from Microsoft, Inc.

With regard to graphically manipulating display elements such as icons, it is sometimes desirable to restrict such movement to certain directions. Oftentimes, such systems are not intuitive, causing the user to make multiple attempts to place a selected display element in a desired location. What is needed, therefore, is an intuitive and simple technique for manipulating display elements in a computer-based system.

SUMMARY

The present invention is a display element manipulation system and methodology for use in a computer-based system. In one aspect of the invention the display element manipulation system provides a user with the ability to graphically manipulate a selected positionable display element rendered on a display device opratively coupled to the computer-based system.

In one aspect of the invention, a display element manipulation system for use in a computer-based system having a display device is disclosed. The system is constructed and arranged to enable a user to graphically reposition a selected positionable display element rendered on the display device from an original display location to a new display location, the selected display element being one of a plurality of display element types. The display element manipulation system is constructed and arranged to determine at least one permissible adjustment direction in which the selected display element may be graphically repositioned, the at least one permissible adjustment direction based upon the display element type and a current operational mode of the computer-based system. In addition, the new display location is determined based upon a distance between the original display location and a current cursor display location and the at least one permissible adjustment direction.

In another aspect of the invention, a display element manipulation system for use in a computer-based system having a display device is disclosed. The system includes a display element selector constructed and arranged to determine, for a user-selected positionable display element, at least one permissible adjustment direction based upon characteristics of the selected display element. The system also includes a display element position determinator constructed and arranged to determine an adjustment command representing, for the selected display element, a motion vector between an original display location and a new display location of the selected display element on the display device, the motion vector defined by an adjustment direction and an adjustment distance.

In a further aspect of the invention, a digital oscilloscope is disclosed. The oscilloscope includes a display device; and a display element manipulation system constructed and arranged to enable a user to graphically manipulate a selected positionable display element rendered on the display device. The manipulation system includes a display element selector configured to determine one or more permissible adjustment directions in which a selected positionable display element may be repositioned; and a display element position determinator configured to determine an adjustment command representing, for the selected display element, a motion vector defined by an adjustment direction and an adjustment position, the motion vector based upon a type of display element selected.

In a still further aspect of the invention, a computer-based system is disclosed. The system includes a display device and a display element manipulation system. The manipulation system is constructed and arranged to enable a user to graphically manipulate a selected positionable display element rendered on the display device. The manipulation system includes a display element selector configured to determine one or more permissible adjustment directions in which a selected positionable display element may be repositioned; and a display element position determinator configured to determine an adjustment command representing, for the selected display element, a motion vector defined by an adjustment direction and an adjustment position, the motion vector based upon a type of display element selected.

In another aspect of the invention, a method for graphically manipulating display elements on a waveform display in a signal measuring system operatively coupled to a display device is disclosed. The system includes the steps of: (a) identifying a graphically-selected display element; (b) determining one or more permissible adjustment directions in which the selected display element may be moved, the at least one permissible adjustment direction based upon a type of display element and a current mode of operation of the signal measurement system; (c) determining a current cursor display location on the display device; (d) generating a motion vector based on a relative distance and a direction between the current cursor display location and an original display location of the selected display element, the motion vector having a direction limited to a vector sum of one or more of the at least one permissible adjustment direction;

and (e) determining a new display location of the display element defined by the original display location and the motion vector.

In a further aspect of the invention, a method for graphically manipulating display elements rendered on a display device operatively coupled to a computer-based system is disclosed. The method includes (a) identifying a graphically-selected display element; (b) determining one or more permissible adjustment directions in which the selected display element may be moved, the at least one permissible adjustment direction based upon a type of display element and a current mode of operation of the computer-based system; (c) determining a current cursor display location on the display device; (d) a motion vector based on a relative distance and a direction between the current cursor display location and an original display location of the selected display element, the motion vector having a direction limited to a vector sum of one or more of the at least one permissible adjustment direction; and (e) determining a new display location of the display element defined by the original display location and the motion vector.

In a further aspect of the invention, a display element manipulation system for use in a computer-based system having a graphical user interface is disclosed. The display element manipulation system provides a user with the ability to graphically reposition an entire selected positionable display element presented on the graphical user interface such that the display element, after being repositioned, is substantially identical, except for its location, to the display element before being repositioned, the display element manipulation system comprising a display element selector configured to determine one or more permissible adjustment directions for a selected positionable display element based upon a type of selected display element and a current operational mode of the computer-based system.

In another aspect of the invention, a computer program product is disclosed. The product comprises a computer readable medium having computer program instructions stored thereon, wherein the computer program instructions, when executed by a processor, provide a display element manipulation system that enables a user to graphically reposition an entire selected positionable display element rendered on a graphical user interface such that the display element, after being repositioned, is substantially identical, except for its location, to the display element before being repositioned, the display element manipulation system comprising a display element selector configured to determine one or more permissible adjustment directions for a selected positionable display element based upon a type of selected display element and a current operational mode of a computer-based system operatively coupled to the display device.

In another aspect of the invention, a computer program product for graphically manipulating display elements on a waveform display in a signal measuring system having a graphical user interface. The computer program product includes a computer readable medium; computer program instructions stored on the computer readable medium such that, when executed by a computer, the computer performs a process including (a) identifying a graphically-selected display element; (b) determining one or more permissible adjustment directions in which the selected display element may be moved, the at least one permissible adjustment direction based upon a type of display element and a current mode of operation of the signal measurement system; (c) determining a current cursor display location on the display device; (d) generating a motion vector based on a relative distance and a direction between the current cursor display location and an original display location of the selected display element, the motion vector having a direction limited to a vector sum of one or more of the at least one permissible adjustment direction; and (e) determining a new display location of the display element defined by the original display location and the motion vector.

Further features and advantages of the present invention as well as the structure and operation of various embodiments of the present invention are described in detail below with reference to the accompanying drawings. In the drawings, like reference numbers indicate identical or functionally similar elements. Additionally, the left-most one or two digits of a reference number identifies the drawing in which the reference number first appears.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIGS. 5A and 5B are a diagram illustrating an exemplary display element manipulation table utilized by the display element position determinator shown in FIG. 4;

DETAILED DESCRIPTION

Figure 1A:
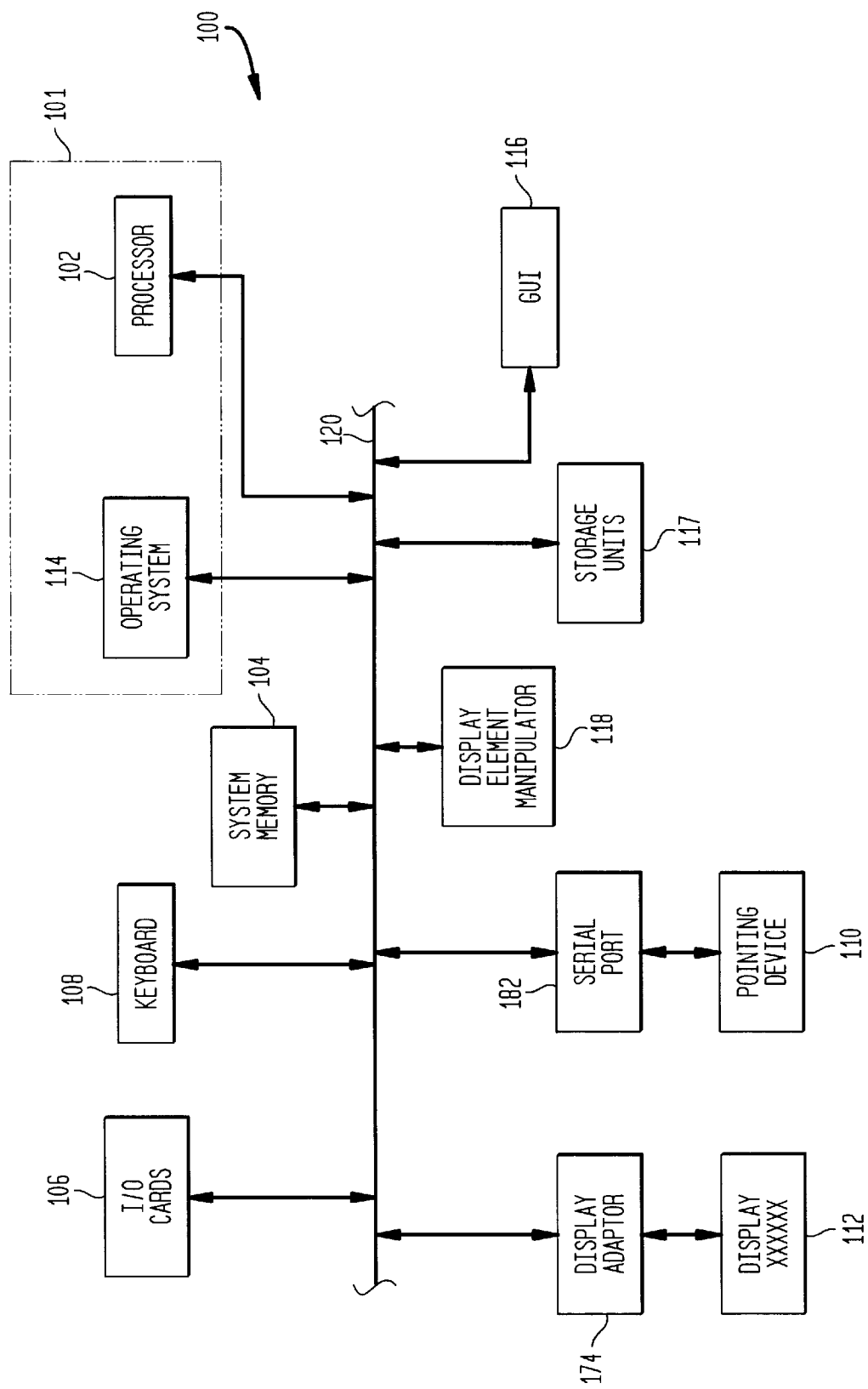
FIG. 1A is a functional block diagram of a computer-based system suitable for implementing the display element manipulation system and method of the present invention.
Figure 1B:
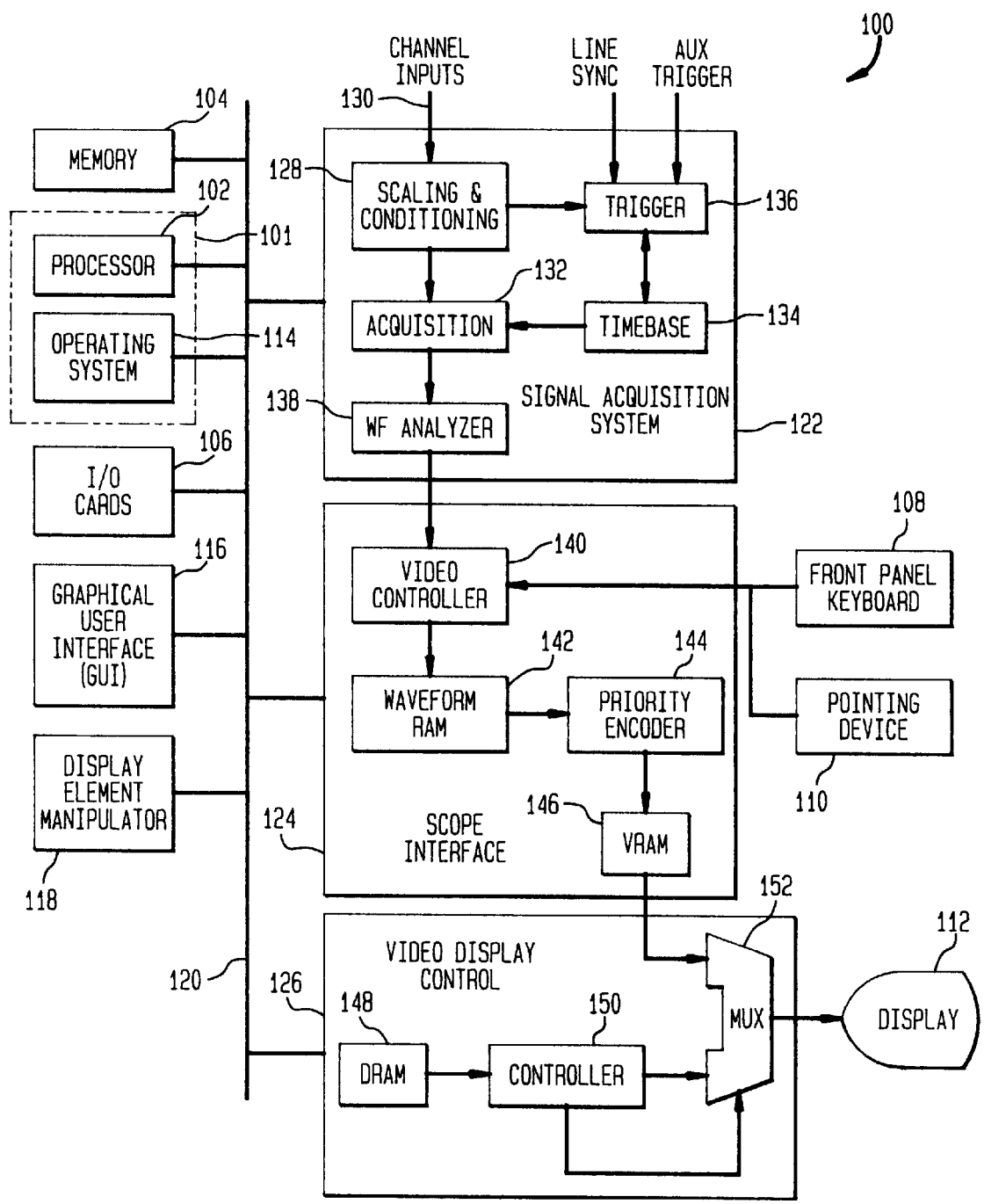
FIG. 1B is a functional block diagram of a digital oscilloscope having a graphical user interface suitable for implementing the display element manipulation system and method of the present invention.

The present invention is a display element manipulation system and method that may be implemented in a computer-based system operatively coupled to a display device. Although any computer-based system may incorporate the present invention, the present disclosure is directed to a computer-based signal measurement system having a graphical user interface. In one embodiment of the present invention, the present invention is implemented in a test and measurement instrument such as a digital or analog oscilloscope, logic analyzer, network analyzer, spectrum analyzer or waveform generator. FIG. 1A is a functional block diagram of an exemplary computer-based system while FIG. 1B is a functional block diagram of an exemplary digital oscilloscope suitable for implementing the display element manipulation system and method of the present invention.

FIG. 1A is a functional block diagram of an exemplary computer-based system also suitable for implementing the present invention. Computer system 100 is but one example of many possible computer system configurations capable of being used with the present invention is illustrated. The computer system 100 is preferably a general purpose computer system which is programmable using a high-level computer programming language.

Computer system 100 includes a number of basic subsystems represented by blocks for ease of illustration. The computer system 100 includes a processor 102, a memory unit 104, input/output interface cards 106, storage units 117 such as a hard disk drive and a floppy disk drive, one or more input devices such as keyboard 108 and pointing devices 110 and display 112. The memory 104 is used for storage of program instructions and for storage of results of calculations performed by the processor 102. In a preferred embodiment, the memory 104 includes random access memory (RAM). The display 112 is preferably a liquid crystal display and is logically or physically divided into an array of picture elements referred to as pixels. The inputs/output interface cards 106 may be modem cards, network interface cards, sound cards, etc. Additional subsystems such as a display adaptor 174 and others are shown.

The processor 102 is typically a commercially available processor such as the Pentium microprocessor, PowerPC microprocessor, SPARC processor, PA-RISC processor or a 68000 series microprocessor. Many other processors are also available. Such a processor usually executes a program referred to as an operating system 114 such as the various versions of the Windows operating systems from Microsoft Corporation, the NetWare operating system available from Novell, Inc., or the Unix operating system available from many vendors such as Sun Microsystems, Inc. and Hewlett-Packard Company. The operating system 114 controls the execution of other computer programs such as a graphical user interface (GUI) 116 and the display element manipulator 118, and provides scheduling, input/output control, file and data management, memory management and related services. The processor 102 and operating system 114 define a computer platform shown by dashed block 101, for which application programs and high-level programming languages are written. The functional elements of the digital oscilloscope 100 communicate with each other via one or more buses 120. The interconnection via system bus 120 allows central processor 102 to communicate with each subsystem and to control the execution of instructions from system memory 104 or storage units 117, and the exchange of information between subsystems. The storage unit 117 may include disk drives, magnetic tape, solid state memory, bubble memory, etc. Other arrangements of subsystems and interconnections are possible.

The display element manipulator 118 implements a simple and intuitive method for manipulating waveforms and other display elements presented on the GUI 116. In response to a user-specified cursor position and selection, the display element manipulator 118 adjusts the position of a selected display element along a permissible adjustment direction. The software routines for performing the display manipulation methodology in accordance with the invention typically reside in memory 104 and/or disk storage devices, and may be stored on a computer-readable medium such as, for example, magnetic disk, compact disc or magnetic tape and may be loaded into the digital oscilloscope 100 using an appropriate peripheral device as known in the art.

Preferably, this embodiment of the display element manipulator 118 is implemented in a well-known object-oriented programming language such as C++. Those skilled in the art will appreciate that different implementations, including different function names, programming languages, data structures, and/or algorithms may also be used in embodiments of the present invention other than those described below. It should be further understood that the invention is not limited to a particular computer platform, particular operating system, particular processor, or particular high level programming language, and that the hardware components identified above are given by way of example only. The display element manipulator may be implemented, for example, in dedicated hardware, firmware, or any combination thereof.

One application in which the benefits associated with the present invention are particularly noteworthy is in signal measurement systems. As noted, a signal measurement system is a class of computer-based systems that includes generally digital or analog oscilloscope, logic analyzer, network analyzer, spectrum analyzer or waveform generator. Conventional signal measurement systems are first described, followed by a description of an exemplary signal measurement system in which the present invention may be implemented.

Conventional signal measurement systems such as digital oscilloscopes sample, record and display time-varying analog signals. Samples of an input signal are taken and quantized, and the resultant digital representations are stored in a waveform memory under the control of a sampling clock. The acquired data may subsequently be read out as locations in memory are sequentially addressed by a clock signal to provide digital data which can be converted to a time-varying output signal for a waveform display. The sampling clock may be operated at one of several selectable rates depending upon the frequency content of the input signal. The selection of the portion of the analog input signal which is sampled and stored is determined by appropriate triggering circuitry to enable the operator to display the desired portion of the waveform.

There are many types of display elements which can be presented in signal measurement systems in general and test and measurement instruments in particular. For example, in addition to the waveforms representing the signals currently received at the channel inputs, waveforms referred to as function waveforms may also be displayed. Function waveforms are waveforms created by processing the signal waveforms. Such processing may include, for example, performing arithmetic manipulations or combining multiple input signal waveforms in some predetermined manner. The resulting waveforms are placed in a display memory for subsequent retrieval and display. In addition, memory waveforms may also be displayed. Memory waveforms are waveforms which have been stored in memory for later display. In addition to the above waveforms, other display elements such as marker indicators, trigger level indicators, etc. are typically displayed.

Conventional signal measurement systems typically provide a display grid on which the display elements are presented. The display grid divides the coordinate axes into a series of divisions. Waveforms are displayed on the display grid and are scaled vertically and horizontally to facilitate analysis. Typically, the horizontal scale represents sweep speed and is in units of seconds per division, while the vertical scale represents signal amplitude and is in volts per division. The center of the horizontal axis represents the delay or horizontal position of the displayed waveform and is referred herein to as horizontal offset. The center of the vertical axis represents the voltage offset of the displayed waveform and is referred to as vertical offset.

Successful utilization of the signal measurement system requires the ability to adjust the placement of waveforms and other display elements on the display grid. In addition to adjusting the relative sizes of the displayed waveforms, these manipulations typically include adjustments along the two coordinate axes to adjust the vertical and horizontal offsets of a given display element. Conventional signal measurement systems typically have numerous dials and knobs to manipulate the many display elements which may be simultaneously visible on the waveform display.

In some conventional signal measurement systems the placement operations are performed through the use of one or more knobs and/or soft keys. Typically, to adjust a display element, the display element must first be selected using a soft key. Then, the proper knob or control button on a front panel keyboard must be manipulated to achieve the desired position adjustment. In other conventional signal measurement systems, display element manipulation control is provided through a numeric entry on a keypad.

There are many drawbacks to these conventional approaches. One drawback, for example, is that the user must understand the relationship between multiple separate control inputs. Similarly, when there are numeric inputs the user must understand the relationship between the numeric value associated with the control input and the associated actual position of the display element on the display. This is often not the case, causing the user to make multiple attempts to place a selected display element in a desired location.

In addition, due to the limited space on a typical front panel keyboard, conventional signal measurement systems typically assign multiple functions to each control knob or implement a complex hierarchy of soft keys. This results in a complicated display panel which is often difficult to learn and use efficiently. Moreover, the location of a desired function is not always intuitively associated with a higher level soft key and is therefore often difficult to locate.

Referring to FIG. 1B, the digital oscilloscope 100 includes a commonly-available digital oscilloscope designed to acquire, analyze and display a wide variety of signals generally in terms of the voltage of the signals versus time. The digital oscilloscope 100 preferably includes a general purpose computer system, which is programmable using a high level computer programming language, and specially programmed, special purpose hardware for performing signal acquisition, analyze and display functions.

The digital oscilloscope 100 includes a processor 102, a memory unit 104, input/output (I/O) interface cards 106, storage units 117 such as a hard disk drive and a floppy disk drive, one or more input devices such as front keyboard panel 108, pointing devices 110 and display 112. The memory 104 is used for storage of program instructions and for storage of results of calculations performed by the processor 102. In a preferred embodiment, the memory 104 includes random access memory (RAM). The display 112 is preferably a liquid crystal display and is logically or physically divided into an array of picture elements (pixels). The processor 102 and operating system 114 are typically commercially available products, such as those noted above with reference to FIG. 1A. As noted, the operating system 114 controls the execution of other computer programs including display element manipulator 118.

The digital oscilloscope 100 includes a signal acquisition system 122, a scope interface 124 and video display control 126. The signal acquisition system 122 includes a scaling and conditioning unit 128 that receives input signals through channel inputs 130. The scaling and conditioning unit 128 and an acquisition unit 132 include well-known high frequency electronics for signal acquisition, signal conditioning, and analog-to-digital conversion, all of which are controlled by the computer system 101 and are considered to be well-known in the art. Timebase 134 drives the analog-to-digital conversion process performed in acquisition unit 132, specifying when to sample the input signals and how many samples are to be taken. Trigger 136 synchronizes the acquisition process through timebase 134, enabling the user to arrange a trigger event to obtain a stable waveform display of the desired features of one or more of the input signals. Trigger 136 may be based upon a line sync or auxiliary trigger input, as is well known in the art.

The waveform analyzer 138 performs measurement processes for developing the waveform for display. It contains hardware and software to perform well-known operations such as setting the analog-to-digital codes for the acquisition unit 132 and mapping the resulting digital information to the physical pixel locations which are ultimately presented on display 112 under the control of GUI 116. The pointing device 110 and/or the keyboard 108 are used to move a cursor on the GUI-controlled display 112 to select display elements using a cursor. The pointing devices 110 may include any number of pointing devices such as a mouse, trackball or joy stick. Of course, the cursor may be controlled with one or more keyboards 108 located externally or integrated into a front panel of the digital oscilloscope 100.

The scope interface card 124 includes a video controller 140 that controls the rendering of pixels into the waveform random access memory (RAM) 142. It also receives display element control commands and cursor input information from the front panel keyboard 108 and the pointing device(s) 110. The waveform RAM 142 includes a data structure for each pixel location on the display 112. The data structures contain information regarding every display element that is to be drawn at each pixel location. Although there may be multiple display elements which are to be drawn at a given pixel location, only one color may be rendered at that location. The waveform RAM 142 supplies a priority encoder 144 with this information. The priority encoder 144 prioritizes the competing display elements. For example, if the user arranged a marker and a waveform such that they are located in the same pixel location, then the priority encoder 144 selects that display element with a highest predetermined priority. In such an example, the color of the marker is rendered at the pixel location providing a display that appears to show the marker over the waveform. The priority encoder then sends the selected color to the VRAM 146 which then causes the pixel to be rendered in the indicated color.

The video display control 126 includes a dynamic random access memory (DRAM) 148 which contains data specifying a color for each pixel in the display 112. Likewise, the video random access memory (VRAM) 146 also contains data specifying a color for each pixel in the display 112. The computer system 101 controls the information in DRAM 148 while the signal acquisition system 122 controls information in the VRAM 146. For each pixel in the display 112, the video display control 126 selects whether the pixel in the display 112 is specified from VRAM 146 or DRAM 148. In general, information in VRAM 146 includes digitized waveforms being generated by the signal acqustion system 122 with high rates of change that are much too fast for software processing by the computer system 101 for real-time display of the waveforms on display 112.

Video controller 126 includes a controller 150 and a multiplexer 152. Controller 150 controls which of the two inputs to the multiplexer 152 are processed into display signals for transmission to the display 112 under the control of the graphical user interface 116. The controller 150 typically monitors color data sent from the DRAM 148 and may be programmed to switch the multiplexer 152 to a different input when a particular programmed color is received from the DRAM 148. A rectangular pixel area is typically defined within DRAM 148 with the programmed color, typically dark gray. The programmed color is not displayed, but instead serves as a data path switch control for the multiplexer 152. Therefore, within the programmed color rectangle, display data comes from VRAM 146. When various control functions are needed, an interactive dialog box is drawn within the programmed color rectangle.

As with the above-noted computer-based system, the display element manipulator 118 implements a simple and intuitive method for manipulating waveforms and other display elements presented on the GUI 116. In response to a user-specified cursor position and selection, the display element manipulator 118 adjusts the position of a selected display element along a preferred and permissible adjustment direction preferably parallel to one of the coordinate axes. The software routines for performing the display manipulation methodology in accordance with the invention typically reside in memory 104 and/or disk storage devices, and may be stored on a computer-readable medium such as, for example, magnetic disk, compact disc or magnetic tape and may be loaded into the digital oscilloscope 100 using an appropriate peripheral device as known in the art.

As noted, the the display element manipulator 118 may be implemented in any well-known programming language such as C or C++. Those skilled in the art will appreciate that different implementations, including different function names, programming languages, data structures, and/or algorithms may also be used in embodiments of the present invention other than those described herein. It should be further understood that the invention is not limited to a particular computer platform, particular operating system, particular graphical user interface, particular processor, or particular high level programming language, and that the hardware components identified above are given by way of example only. The display element manipulator may be implemented, for example, in dedicated hardware, firmware, or any combination thereof.

Figure 2:
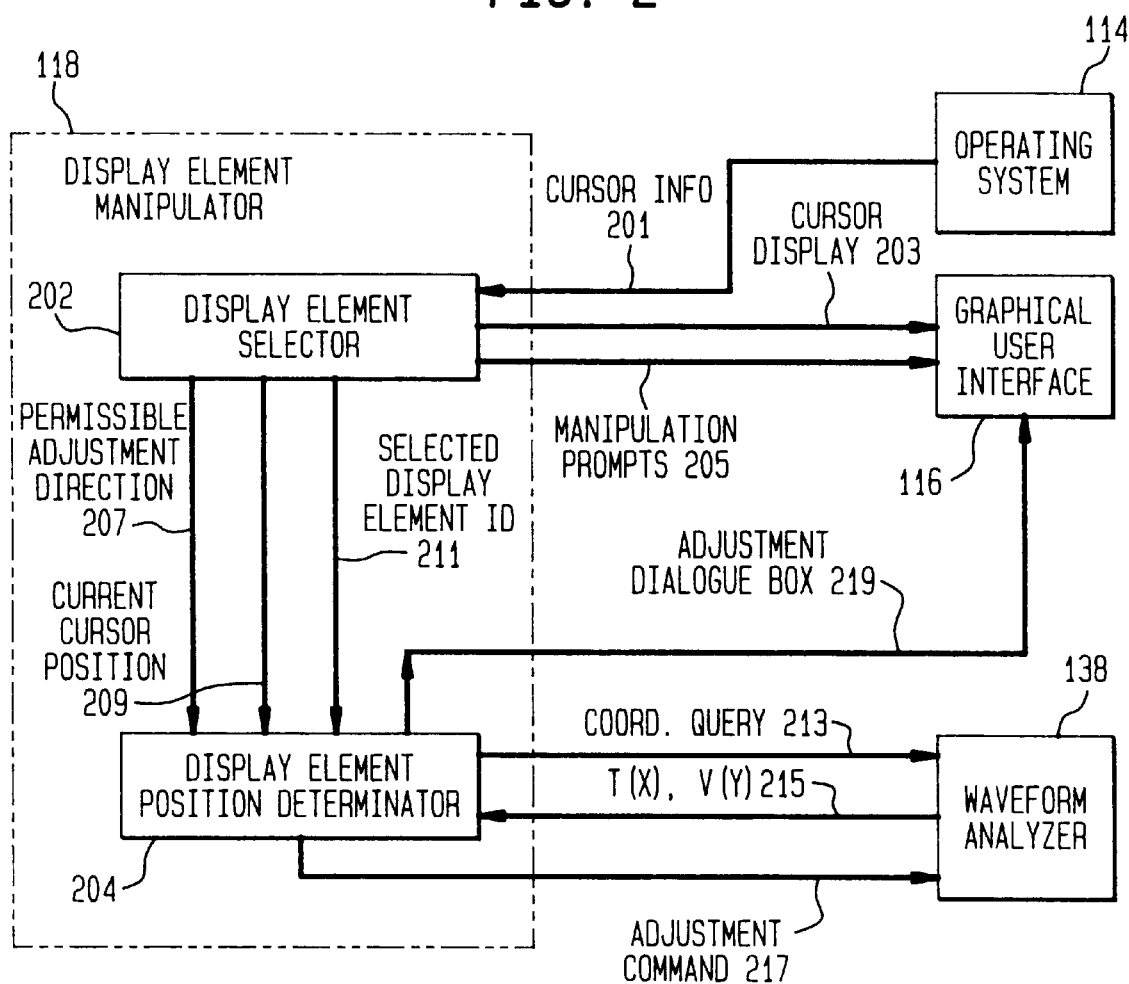
FIG. 2 is a functional block diagram of one embodiment of the display element manipulator illustrated in FIG. 1.

A functional block diagram of one preferred embodiment of the display element manipulator 118 of the present invention implemented in the digital oscilloscope 100 is shown in FIG. 2. The display element manipulator 118 includes a display element selector 202 that determines which display element has been selected by the user and validates that the selected display element may be positioned by the user. If a positionable display element has been selected, then the display element selector 202 determines in which coordinate direction the display element may be moved. A display element position determinator 204 generates an adjustment command corresponding to the selected display element and the desired permissible adjustment direction to effect a desired positional adjustment of the selected display element on the waveform display.

The display element selector 202 determines which display element has been selected by the user and determines permissible adjustment directions given the type of the selected display element and the current mode of operation of the digital oscilloscope 100. The permissible adjustment directions in which the display element may be manipulated at any one time are generally limited to directions parallel to one or both of the two coordinate axes to adjust the vertical and horizontal offsets of the selected display element. Preferably, the display element selector 202 generates display indications to inform the user of the permissible directions of motion for the given display element and mode of operation. The display element selector 202 is described in detail below with reference to FIG. 3.

The display element position determinator 204 determines an adjustment command 217 representing a user-defined adjustment direction and distance for the selected display element. The adjustment direction and distance define a motion vector having a direction parallel to one of the coordinate axes and a magnitude equal to the associated voltage or time at which the display element is to be positioned or over which the display element is to be adjusted.

The adjustment direction is limited by the permissible adjustment direction(s) determined by the selector 202. However, if the display element may be moved in both coordinate axes, then the determinator 204 determines which of the coordinate axes is the axis parallel to the direction in which the user prefers to move the display element.

The motion vector has a magnitude that depends upon the type of display element. The motion vector magnitude is equivalent to the voltage or time associated with the relative change in cursor position when the selected display element is of the type that is to be moved in accordance with a relative change of cursor position. Alternatively, the motion vector magnitude is equivalent to the voltage or time associated with the current cursor position when the selected display element is of the type which is to be moved to the pixel location identified by the current position of the cursor. The display element position determinator 204 generates a command to the waveform analyzer 138 corresponding to the selected display element and the motion vector, thereby effecting a desired change in the position of the selected display element on the waveform display region of the graphical user interface 116. The display element position determinator 204 is described in detail below with reference to FIG. 4.

Figure 3:
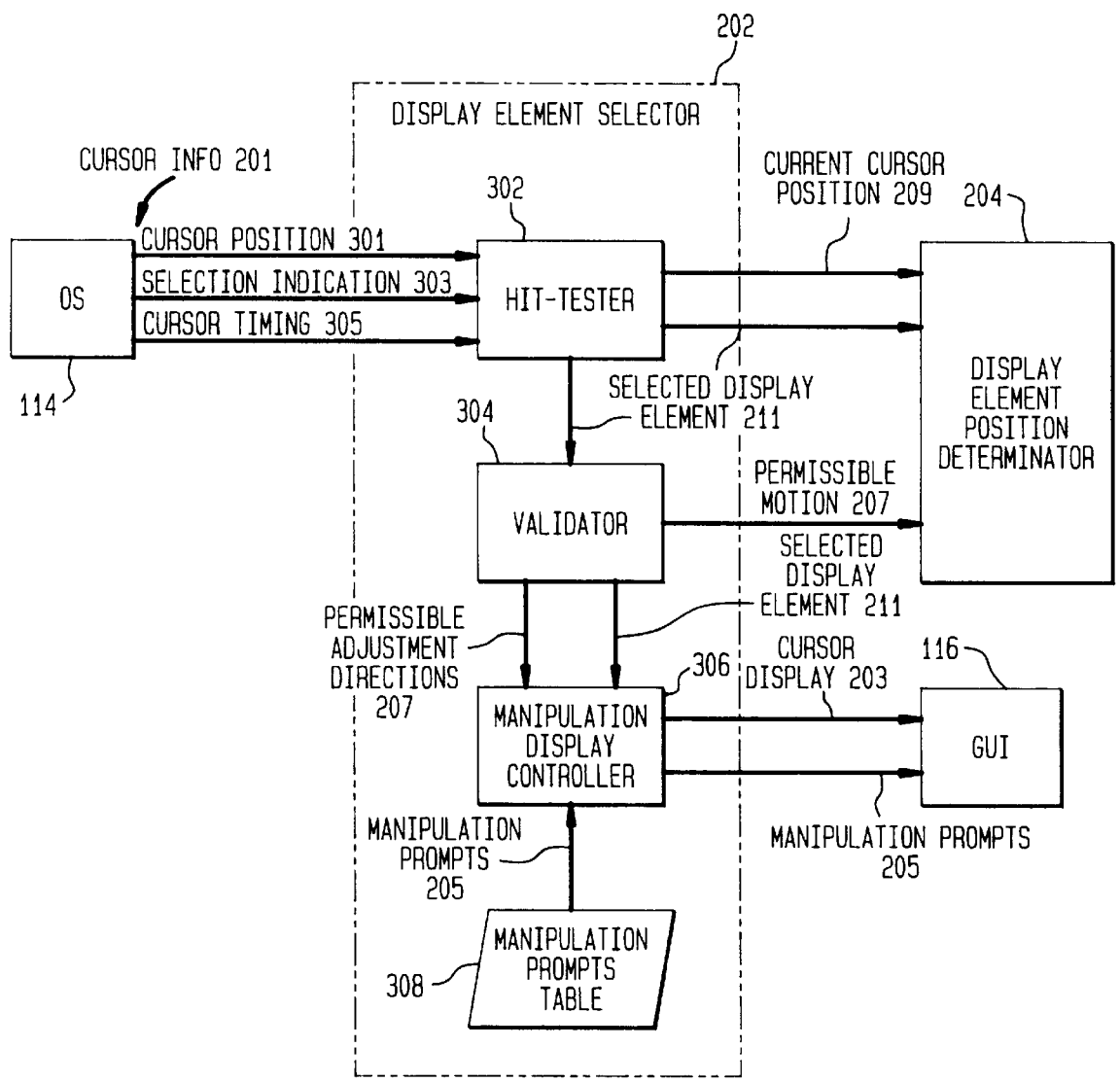
FIG. 3 is a functional block diagram of one embodiment of the display element selector illustrated in FIG. 2.

FIG. 3 is a functional block diagram of the display element selector 202 illustrated in FIG. 2. The display element selector 202 determines the permissible adjustment directions 207 for a selected display element and preferably informs the user of the manipulation options available for the selected display element given the current mode of operation of the digital oscilloscope 100. The display element selector 202 contains a hit-tester 302, a validator 304 and a manipulation display controller 306, all of which are described hereinbelow.

The hit-tester 302 receives cursor information 201 from the operating system 114. The cursor information 201 includes a current cursor position 301 and a selection indication 303 indicating when the user has selected a pixel location associated with the current cursor position. The user may adjust the position of the cursor and make such a selection through the use of the implement pointing device (s) 110 such as a mouse, trackball or trackpad. In one embodiment of the present invention, the determination of the selected display element is made through determining which display element is the display element nearest to the current cursor position 301 when a selection indication 303 is received from the operating system 114. In a preferred embodiment, the hit-tester 302 is that described in commonly owned U.S. Patent Application entitled "System and Method for Efficient Hit-Testing in a Graphical User Interface," filed concurrently herewith, naming as inventor Jay A. Alexander and having assigned application Ser. No. 08/863,461, the specification of which is hereby incorporated by reference in its entirety.

Preferably, the hit-tester 302 determines whether the user has selected a current cursor position that is sufficiently close to a display element to be considered a selection by the user of that display element rather than a selection of a background region or another display element in the waveform display region of the graphical user interface 116. It is understood, however, that the hit-tester 302 may include or interface with other means for determining whether a pixel location has been selected by the user based upon the above and/or other inputs and using other techniques now or later developed.

In accordance with the present invention, a display element is considered to be selected not only when the user activates the appropriate switches associated with the pointing device, but also when the user simply allows the cursor to remain stationary, or dwell, at a particular pixel location for a predetermined period of time. The hit-tester 302 monitors the time the cursor dwells at each pixel location that it covers. If the time duration, referred to as dwell time, is greater than the predetermined threshold, then the user is taken to be considering performing a positive action to make a selection of that pixel location. In this embodiment, the cursor information 201 also includes current cursor timing information 305 to enable the hit-tester 302 to make such a determination.

In this embodiment, when the user dwells the cursor, the nearest display element within a predetermined maximum distance is considered to be the selected display element 211. An identification representing the selected display element is passed to the validator 304 and the display element position determinator 204 as shown in FIG. 3. The validator 304 validates whether the selected display element 211 is movable or positionable in the current mode of operation of the digital oscilloscope 100. If the selected display element is a positionable display element, then the validator 304 determines which coordinate directions are permissible adjustment directions in which the selected display element 211 may be moved.

As is well-known in the art, there are different modalities in test and measurement instruments such as digital oscilloscope 100. In addition to having inherent limitations as to the axis along which the display element may be positioned, certain display elements may not be positionable in a particular mode of operation. Take for example, marker indicators. In the exemplary digital oscilloscope 100, there are two (X, Y) pairs of marker indicators, referred to as (Ax, Ay) and (Bx and By) marker indicators. In certain operational modes of the digital oscilloscope 100, the marker indicators are not independently positionable but instead are paired together. In such a mode of operation, if the user moves an marker indicator (Ax), the associated marker indicator (Ay) automatically follows across the assigned waveform on the graphical user interface 116. In this exemplary mode of operation, the user cannot independently change the position of the marker indicator Ay. In another mode of operation, the marker indicators may be set to track measurements. In this operational mode, the marker indicators delineate the extent of the signal that was used to perform the most recent measurement. In such a mode of operation, neither marker indicator is positionable by the user. As one skilled in the relevant art would find apparent, other types of display elements may have permissible adjustment directions which are limited due to the above and other characteristics of the display element and implementing signal measurement system.

The validator 304 provides the manipulation display controller 306 and the display element position determinator 204 with the permissible adjustment direction 207. The manipulation display controller 306 generates predetermined display indications to inform the user that the cursor has been dwelling over or adjacent to a display element. In addition, the display indications preferably inform the user of the permissible adjustment directions in which the selected display element may be moved. In a preferred embodiment of the present invention, the manipulation display controller 306 generates a cursor display request 203 to change or alter the shape of the cursor on the waveform display. In a preferred embodiment, the new shape of the displayed cursor indicates the permissible adjustment directions. These shapes include, for example, a horizontal-double-headed arrow, a vertical-double-headed arrow, a four-headed-arrow and a cursor indicating that no movement is possible, such a circle with a line running diagonally through it. The manipulation display controller 306 implements the cursor display change by making a system call illustrated by a cursor display output 203 to the graphical user interface 116. Invocation of such a call to the graphical user interface 116 is considered to be well-known in the art.

In addition to making the above-noted change in cursor display, the manipulation display controller 306 preferably generates a manipulation prompt 205 providing the user with textual instructions identifying which manipulation options are available for the selected display element and the current operational mode of the digital oscilloscope 100. In one embodiment, the manipulation display controller 306 accesses a manipulation prompts table 308 for the appropriate text to request the graphical user interface 116 to display. This table is indexed by the manipulation display controller 306 with the selected display element 211 and the permissible adjustment direction 207 to obtain the proper textual instructions appropriate for the selected display element and the current operational mode of the oscilloscope 100. Like the cursor change request, calls to the graphical user interface 116 to display the manipulation prompts is considered to be well-known in the art.

Figure 4:
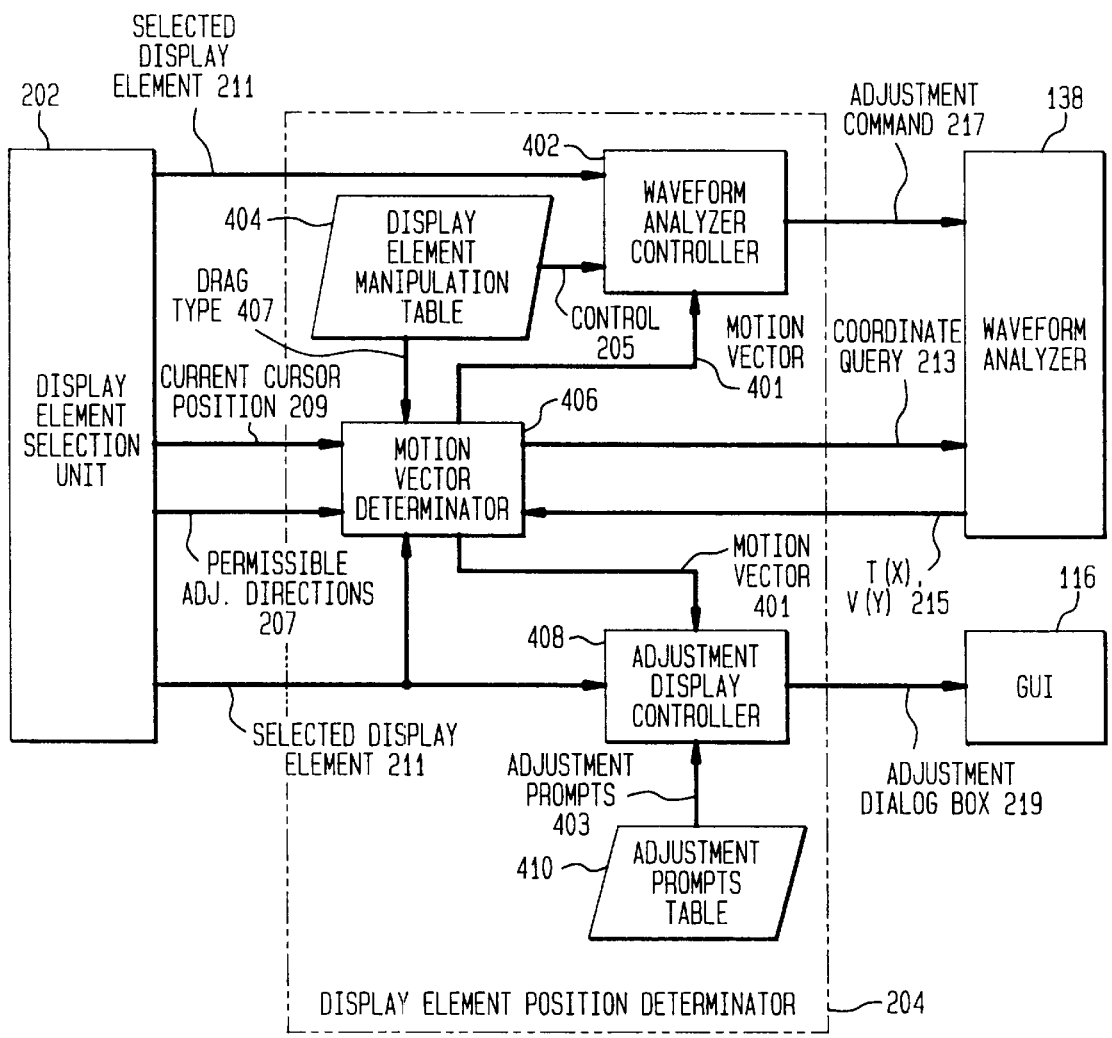
FIG. 4 is a functional block diagram of the display element position determinator illustrated in FIG. 2.

FIG. 4 is a functional block diagram of the display element position determinator 204 illustrated in FIG. 2. The display element position determinator 204 includes a motion vector determinator 406 that determines a motion vector 401 in accordance with the permissible adjustment direction of the selected display element and the current position of the cursor, a waveform analyzer controller 402 which generates the adjustment command based upon the selected display element and the user-defined motion vector, and an adjustment display controller 408 which generates adjustment dialog boxes on the graphical user interface 116 for the selected display element and motion vector. Each of these components of the display element position determinator 204 are described in detail hereinbelow.

The motion vector determinator 406 receives the current cursor position 209 and the permissible adjustment direction 207, preferably from the display element selector 202. The motion vector determinator 406 also receives a drag type 407 from a display element manipulation table 404. As will be described in detail below, the drag type includes information regarding whether the selected display element is a relative movement or absolute movement type of display element. The motion vector determinator 406 generates a motion vector 401 that represents the desired permissible direction and magnitude that the selected display element is to be moved due to the user's control of the cursor and selection switches.

The motion vector determinator 406 determines the direction of the motion vector 401 based upon the permissible adjustment directions in which the selected display element may be moved and the current cursor position 209. If the selected display element can only be moved in a single coordinate axis, then the motion vector determinator 406 determines the vector component of the cursor movement which is parallel to the permissible adjustment direction. Under these circumstances, the direction of the motion vector 401 is determined to be represented by this vector component of the cursor movement.

On the other hand, if the selected display element may be moved in the horizontal and vertical axis directions, then the motion vector determinator 406 must determine which of the two permissible adjustment directions is the desired direction of movement. In a preferred embodiment of the present invention, the desired direction of movement is considered to be the dominant vector component of the initial cursor movement. This dominant direction is preferably determined by monitoring the initial movement of the cursor for a predetermined period of time or distance. The coordinate vector components of the vector from the original cursor position to the current cursor position at the expiration of the initial period are determined. The coordinate vector components of the cursor movement are compared and the desired direction is considered to be that coordinate direction for which the associated vector component is greatest.

In an alternative embodiment, the dominant direction is determined to be the direction for which the vector coordinate of the cursor movement is greater than the orthogonal component by a predetermined amount. In other words, the aspect ratio of the two coordinate vector components of the cursor movement must be greater than some predetermined threshold for the cursor movement is considered to be indicative of the user's desire to move the selected display element in a particular coordinate direction.

The motion vector magnitude represents a voltage (vertical axis) or time (horizontal axis) associated either with the relative change in cursor position or the current cursor position, depending upon the type of display element which has been selected. There are essentially two types of display elements in this regard. Certain display elements are to be positioned at the location of the cursor and are therefore positioned in accordance with the absolute value of the voltage or time associated with the current cursor position. On the other hand, certain display elements are to be moved in accordance with the relative change in cursor position. For these display elements, the voltage or time associated with the relative difference in the motion vector direction is calculated and provided as the magnitude of the motion vector 401 provided to the waveform analyzer controller 402 and adjustment display controller 408.

When the motion vector determinator 406 receives a current cursor position 209 from the display element selector 202, it obtains the associated vertical and horizontal coordinate values (voltage and time) for the horizontal and vertical scaling associated with the selected display element. The motion vector determinator 406 generates a coordinate query 213 to the waveform analyzer 138 for such information. The coordinate query 213 includes the current cursor position 209 and the selected display element 211. The waveform analyzer 138 generates a reply 215 that contains the associated time and voltage values. As the user moves the current cursor position 209 while continuing to select the selected display element (that is, drag the cursor), the motion vector determinator 406 periodically performs the above-noted functions to maintain the associated time and voltage for the current cursor position in the horizontal and vertical scaling associated with the selected display element.

For example, the user may "click and drag" the cursor using a mouse pointing device. If the display element is of the type which is to be positioned at the current cursor location, then the magnitude of the motion vector 401 is set equal to the time or voltage associated with the current cursor position 209. On the other hand, if the display element is of the type which is positioned at a location on the waveform display that is based upon the relative change in the cursor position, then the motion vector determinator 406 sets the magnitude of the motion vector 401 to the difference between the time/voltage of the previous cursor position and the current cursor position 209.

As noted, in a preferred embodiment, the motion vector determinator 406 determines the direction and magnitude of motion vector 401 based upon the component coordinate vectors. This is because the displayed waveform and other display elements are presented on the display grid according to the vertical and horizontal offsets. In addition, a user generally cannot operate a mouse, trackball, trackpad or other pointing device to cause the cursor to move in a perfectly straight line. If the display element manipulator 118 was responsive to changes in both coordinate axis, it would likely result in the user obtaining an undesirable change in one of the coordinate axis. This undesirable change in display element location will require subsequently adjustments to reset the display element to its original position using one or more conventional mechanisms.

Furthermore, by allowing the user to adjust the position of the selected display element in one coordinate direction determined solely by the movement of the cursor eliminates the need for the user to explicitly select the desired coordinate direction. This results in a display element manipulation system which is more intuitive than conventional approaches. That is, the display element manipulation system of the present invention enables the user to move a selected display element in a single direction likely to be the desired direction of movement without having to make any additional selections regarding which direction of movement is desired.

The adjustment display controller 408 receives the motion vector 401 from the motion vector determinator 406 and the selected display element 211 from the display element selector 202. Based upon these two inputs, the adjustment display controller 408 presents an adjustment dialog box 219 on the graphical user interface 116. Preferable, the adjustment display controller 408 accesses an adjustment prompts table 410 for the adjustment prompts 403. The adjustment dialog box 219 preferably contains an identification of the selected display element that is currently being adjusted and the current voltage or time value associated with the adjustment direction. In a preferred embodiment, the adjustment dialog box 219 also contains control inputs which enable the user to adjust the selected display element in the desired direction. These control efforts may be provided, for example, in the form of commonly known spin buttons.

Additional display features may also be provided. For example, the adjustment dialog box command 219 may contain pointers to bit maps which pictorially represent that status and control for the selected display elements. Furthermore, the adjustment dialog box command 219 may contain a request to present the current value in the same color as the selected display element which is being manipulated. It is noted that the spin buttons are preferably arranged side by side horizontally with arrows pointing left and right or vertically with arrows pointing up and down to reinforce the appropriate adjustment direction. Generation of the appropriate commands to generate the adjustment dialog box are considered to be well-known in the art. In addition, it should be appreciated that other information may be provided to the user through the graphical user interface, depending upon the particular application and implementing system.

The waveform analyzer controller 402 receives the motion vector 401 from the motion vector determinator 406 and the selected display element 211 from the display element selector 202. The waveform analyzer controller 402 generates a drag state which represents the combination of the selected display element 211 and the direction of the motion vector 401. The waveform analyzer controller 402 accesses a display element manipulation table 404 to obtain a control input 405 associated with the calculated drag state. The waveform analyzer controller 402 generates the adjustment command 217 for the waveform analyzer 138 containing the control 405 obtained from the display element manipulation table 404 and the magnitude of the motion vector 401. The waveform analyzer 138 responds to the adjustment command 217 to effect the desired position adjustment of the selected display element on the waveform display.

FIGS. 5A and 5B illustrate one embodiment of the display element manipulation table 404 described above. The display element manipulation table 404 includes a drag state 502 which identifies each of the possible adjustments which can be made to each display element. A display element control ID 504 identifies the adjustment control input 217 which is appropriate for the waveform analyzer 138 implemented in digital oscilloscope 100. The drag type 506 identifies the direction (horizontal or vertical) and type of movement (relative or absolute) for the associated drag state. Finally, signal ID 508 is an identifier which is provided to the waveform analyzer 138 to identify the display element which is to be adjusted in accordance with the control command. For example, in the exemplary digital oscilloscope 100 implementing the display element manipulator 118 of the present invention, there are four channels, Channel 1, Channel 2, Channel 3 and Channel 4. The digital oscilloscope 100 has a single time base generator which results in the signal waveforms associated with these channels being linked horizontally. Thus, the signal waveforms associated with channels 1–4 are independently adjustable along the vertical axis while being linked in the horizontal direction. Accordingly, the drag state 502 associated with the position adjustment of the signal waveforms in the vertical direction are provided in rows 2–5. Associated with each of these drag states is an associated channel offset control 504 (CHAN#_OFFSET_CTRL). On the other hand to move any of the channels 1–4 in the horizontal direction, the drag state MAIN_POSN is provided (FIG. 5B) which causes the waveform analyzer 138 to adjust all of the displayed channel waveforms together. It is also noted in the drag type 506 for the four channels adjustments in the vertical and horizontal directions are relative rather than absolute.

Figure 6:
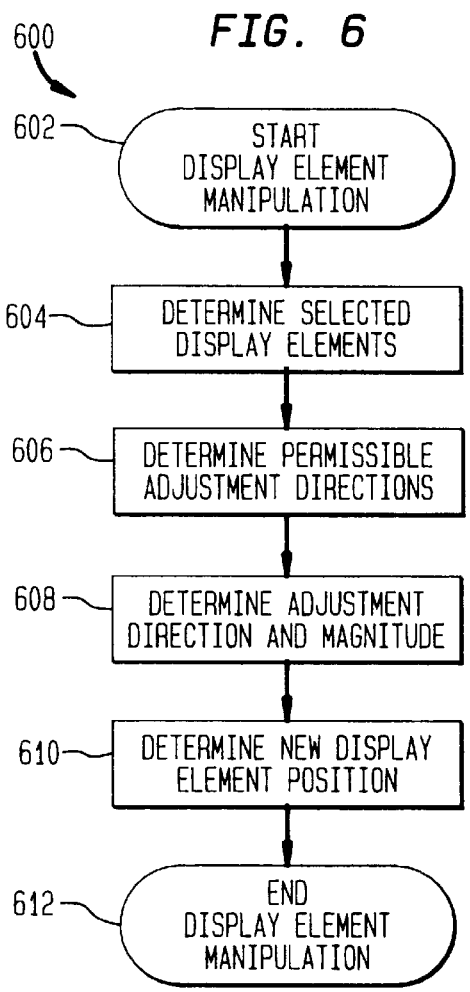
FIG. 6 is a flowchart of one embodiment of the display element manipulation process of the present invention.

FIG. 6 is flowchart of one embodiment of the display element manipulation process of the present invention. At start block 602 the display element manipulation process 600 begins, preferably due to the cursor dwelling near a display element on the waveform display. At block 604, the manipulation characteristics of the selected display element are determined. Here, the display element manipulator 118 determines the current position of the selected display element and performs an initial verification that the selected display element is one which can be moved either in the horizontal or vertical direction in the current mode of operation. If the cursor is dwelling near a positionable display element, then the display element manipulator 118 also provides the graphical user interface with display commands and data to change the cursor display to inform the user of the permissible adjustment directions as well as to provide textural information to assist the user.

At block 606 the display element manipulator 118 determines the permissible adjustment directions. As noted, this determination is based upon the type of display element and current operation mode of the oscilloscope 100. Once it has been determined that a positionable display element has been selected and desired to be moved in a permissible direction, processing continues at block 608 whereat the adjustment direction and magnitude is determined. This determination is based upon the extent to which the cursor is moved in the permissible adjustment direction of the selected display element. At block 610 the display element manipulator 118 determines the appropriate adjustment control input to the waveform analyzer 138 to effect the desired position adjustment. Subsequently processing ceases at block 612.

Figure 7:
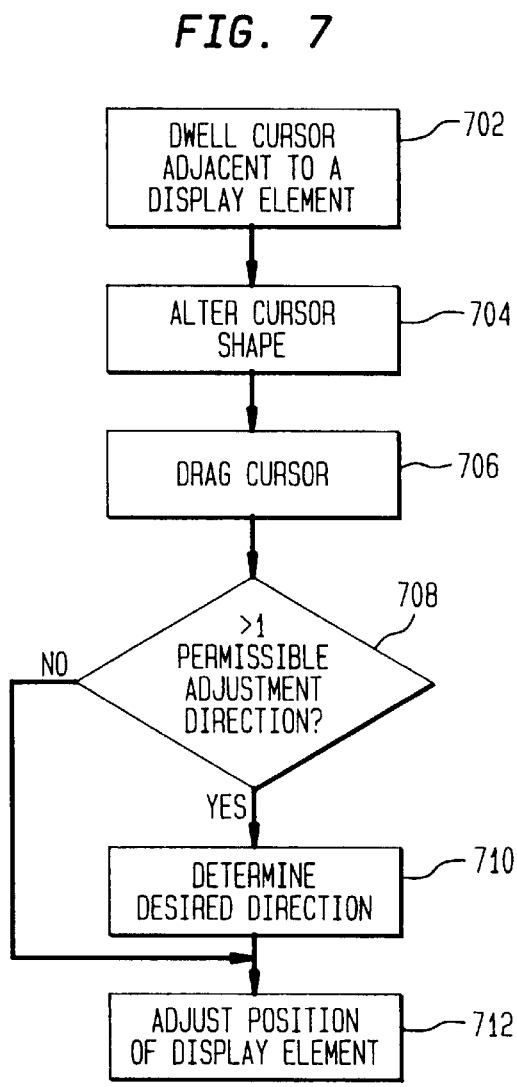
FIG. 7 is a flowchart of one embodiment of the display element manipulation process performed on the graphical user interface illustrated in FIG. 1.

FIG. 7 is a flowchart of the actions by the user and the display element manipulation system 118 with the graphical user interface 116. At block 702, the users dwells the cursor over or adjacent to a display element of interest on the graphical user interface 116. The display element manipulator 118 recognizes the stationary condition of the cursor, determines which display element has been selected and determines the permissible adjustment directions for the selected display element. Also, the shape of the cursor is altered to provide such information to the user at block 704.

At block 706, the user drags the cursor in a direction having a vector component parallel to one of the permissible adjustment directions. The display element manipulator 118 determines at block 708 whether there are two permissible adjustment directions. If so, then at block 710, the desired adjustment direction is determined and the vector component of the desired direction is calculated. At block 712, the selected display element is adjusted in position in accordance with the vector component determined at either block 706 or 710. The magnitude of the adjustment is based upon the type of display elements and the distance that the cursor is dragged by the user.

Figure 8:
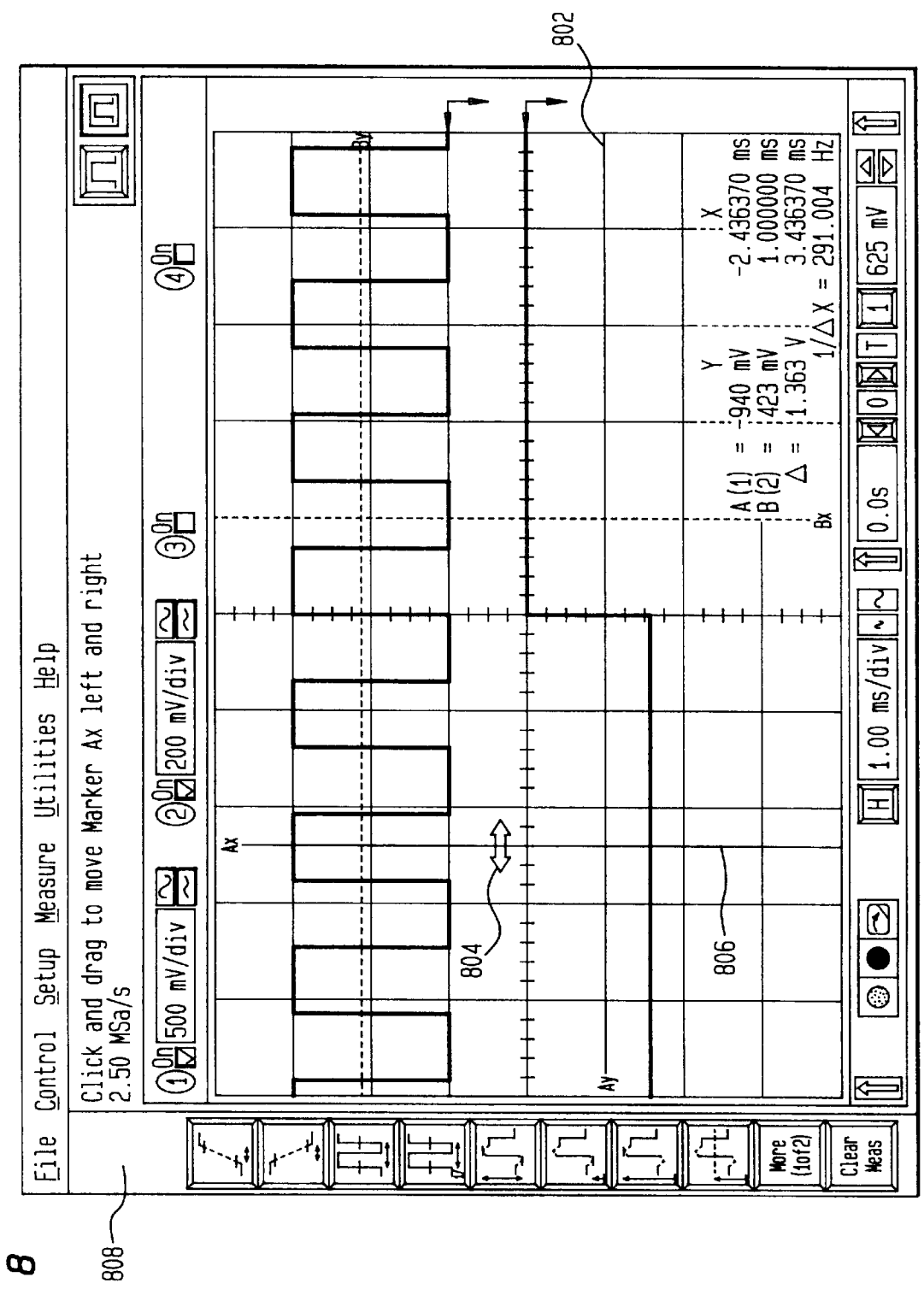
FIG. 8 is an exemplary graphical user interface after the cursor has been dwelling at marker indicator Ax causing the cursor display to change and textual instructions to be presented on the graphical user interface.

FIG. 8 is an exemplary graphical user interface 116 containing a waveform display 802 and various control bars around its periphery. In this example, the user positions the cursor 804 over the marker indicated $A_x$ 806. As shown, the display element manipulator 118 requests that the graphical user interface 116 alters the cursor from a standard arrow head to a horizontal double-headed arrow. This informs the user that the permissible adjustment direction of the selected marker indicator Ax is along the horizontal axis.

The display element manipulator 118 also presents textual information to the user on the graphical user interface 116 to provide the user with additional information regarding the permissible adjustments for the selected display element 806. Here, the textual information is presented in an information region 808 indicating that the user may click and drag the cursor to move the marker indicator Ax left and right.

Figure 9:
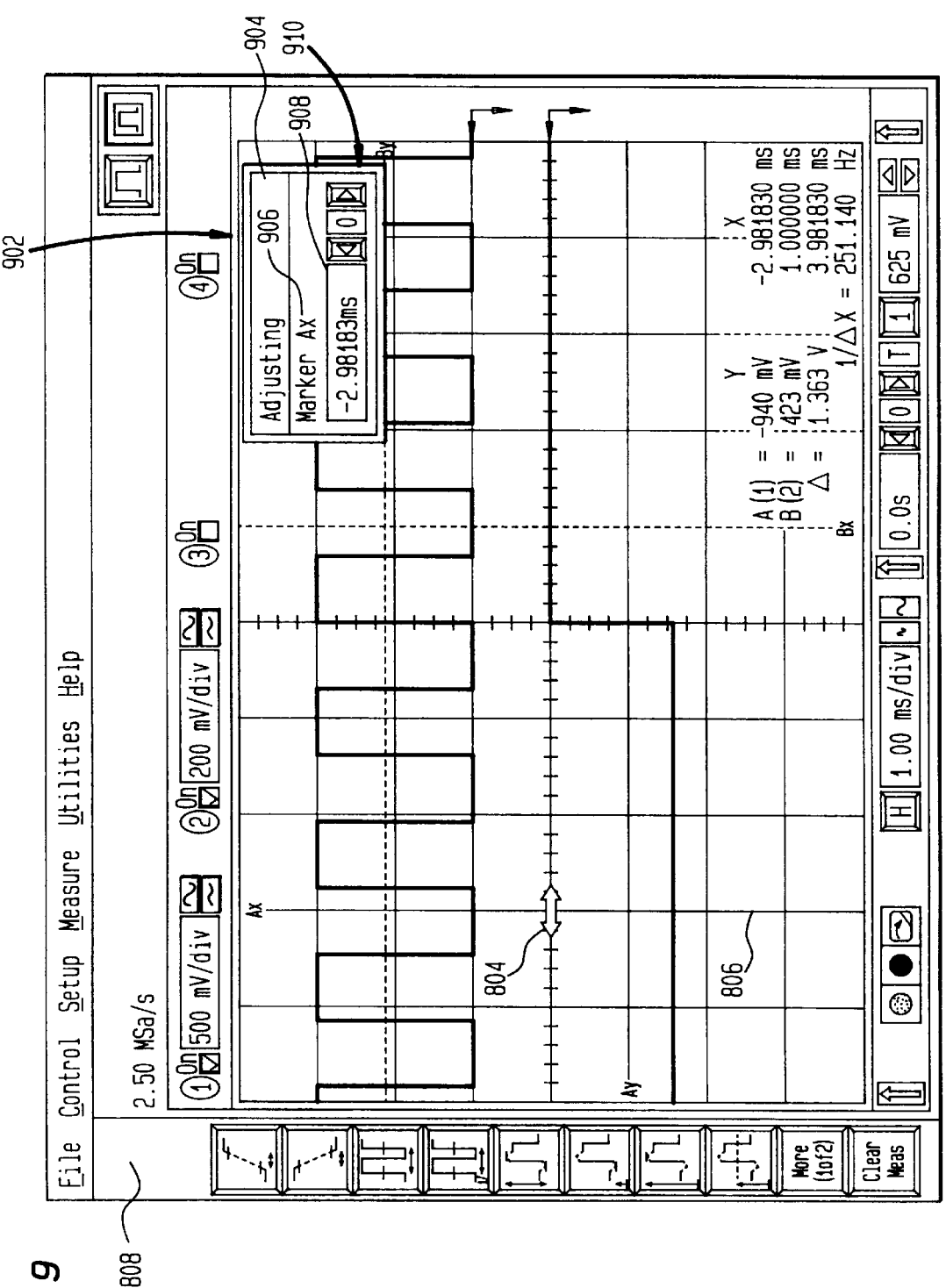
FIG. 9 is an illustration of the graphical user interface illustrated in FIG. 8 after the user has moved the marker indicator Ax causing the adjusting dialog box to appear on the graphical user interface.

FIG. 9 is an illustration of the waveform display illustrated in FIG. 8 after the user has moved the marker indicator Ax 806 leftward along the horizontal axis. As shown in FIG. 9, the user has moved the cursor 804 in a direction that has a vector component that is parallel to the horizontal axis equal to the change in distance of the marker indicator Ax. Upon movement of the marker indicator Ax, the display element manipulator 118 removes the textual instructions from the information display area 808. In addition, the display element manipulator 118 presents an adjustment dialog box 902 on the graphical user interface 116. The adjustment dialog box 102 has a title "Adjusting" 904 in a shaded region below which an identification 906 of the selected display element, "Marker Ax" is provided.

The adjustment dialog box 902 also contains a position status indication 908 presenting the value of the current position of the selected display element on the coordinate axis along which it is being positioned. Here, the marker indicator Ax is currently at −2.98183 milliseconds. In addition, the adjustment dialog box 902 also provides spin buttons 910 to enable the user to move the selected display element in fine increments in either of the permissible adjustment directions. Preferably, the spin buttons are presented in a manner which indicates the permissible adjustment directions. Accordingly, the spin buttons 910 have two buttons with arrow heads pointing in the left and right directions. Between these two buttons is an adjustment button labeled "0" which enables the user to quickly and easily reset the selected display elements.

Figure 10:
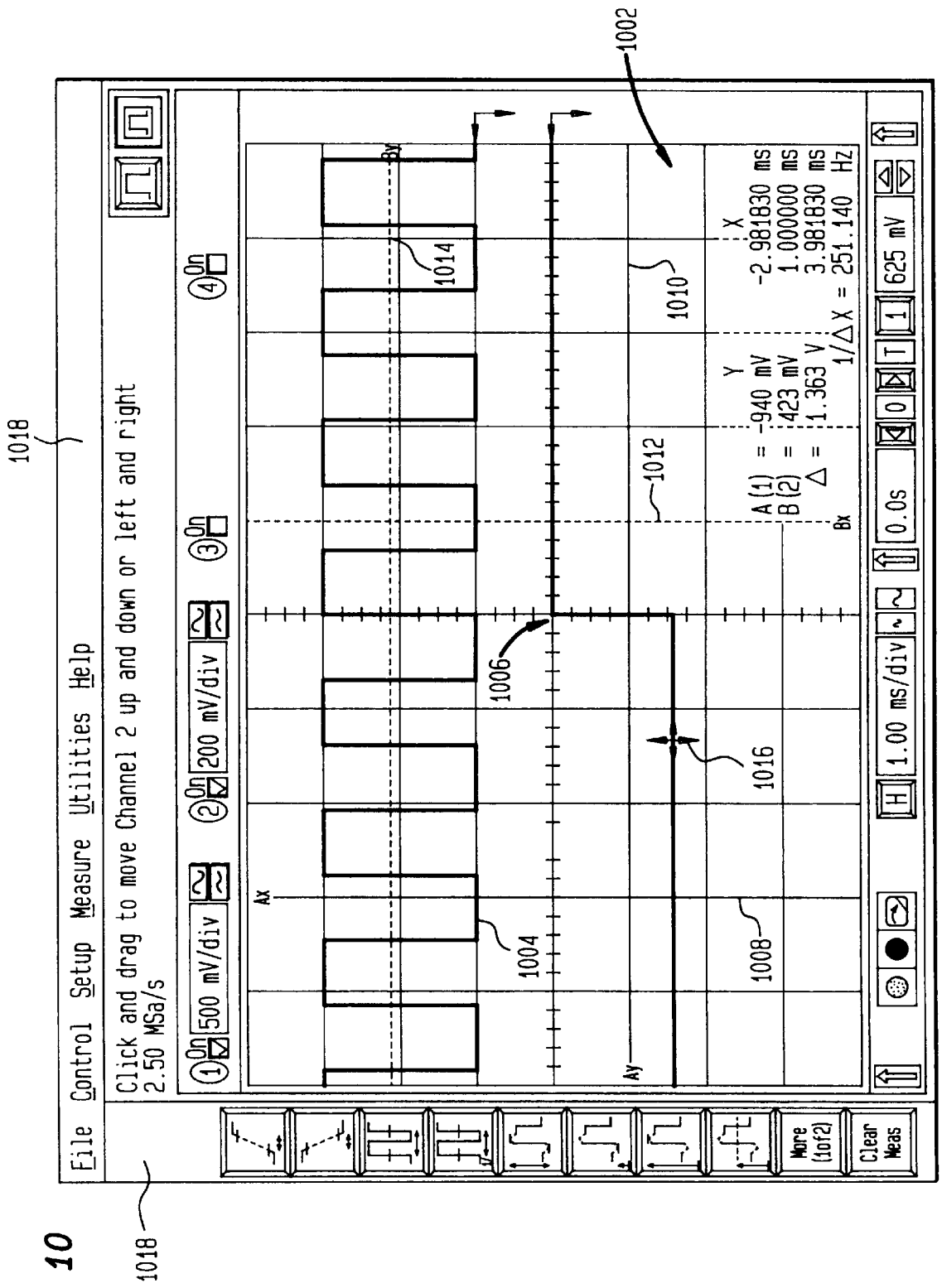
FIG. 10 is an exemplary graphical user interface after the cursor has been dwelling at a waveform display element causing the cursor display to be altered and textual instructions on the graphical user interface.

An exemplary manipulation of a waveform display element is provided herein below with reference to FIGS. 10–12. FIG. 10 is an exemplary waveform display after the user has dwelled the cursor at a pixel location nearest to the channel 2 waveform display. Here, the graphical user interface 116 has the waveform display 802 in which there are two channels of both pairs of marker indicators displayed. The channel 1 waveform display 1004 is a square waveform at 500 mV/div while the channel 2 waveform is also a square waveform at 200 mV/div. The marker indicators Ax 1008 and Ay 1010 and Bx 1012 and By 1014 are also visible on the waveform display.

When the user dwells the cursor 1016 nearest to the channel 2 waveform, the display element manipulation system 118 alters the display of the cursor to a four-headed arrow as shown in FIG. 10. This configuration of the cursor indicates that the selected display element, channel 2 waveform, may be moved in both the horizontal and vertical directions. Textual information in information field 1018 stating that the user may click and drag the cursor to move the channel 2 waveform up and down or left and right.

Figure 11:
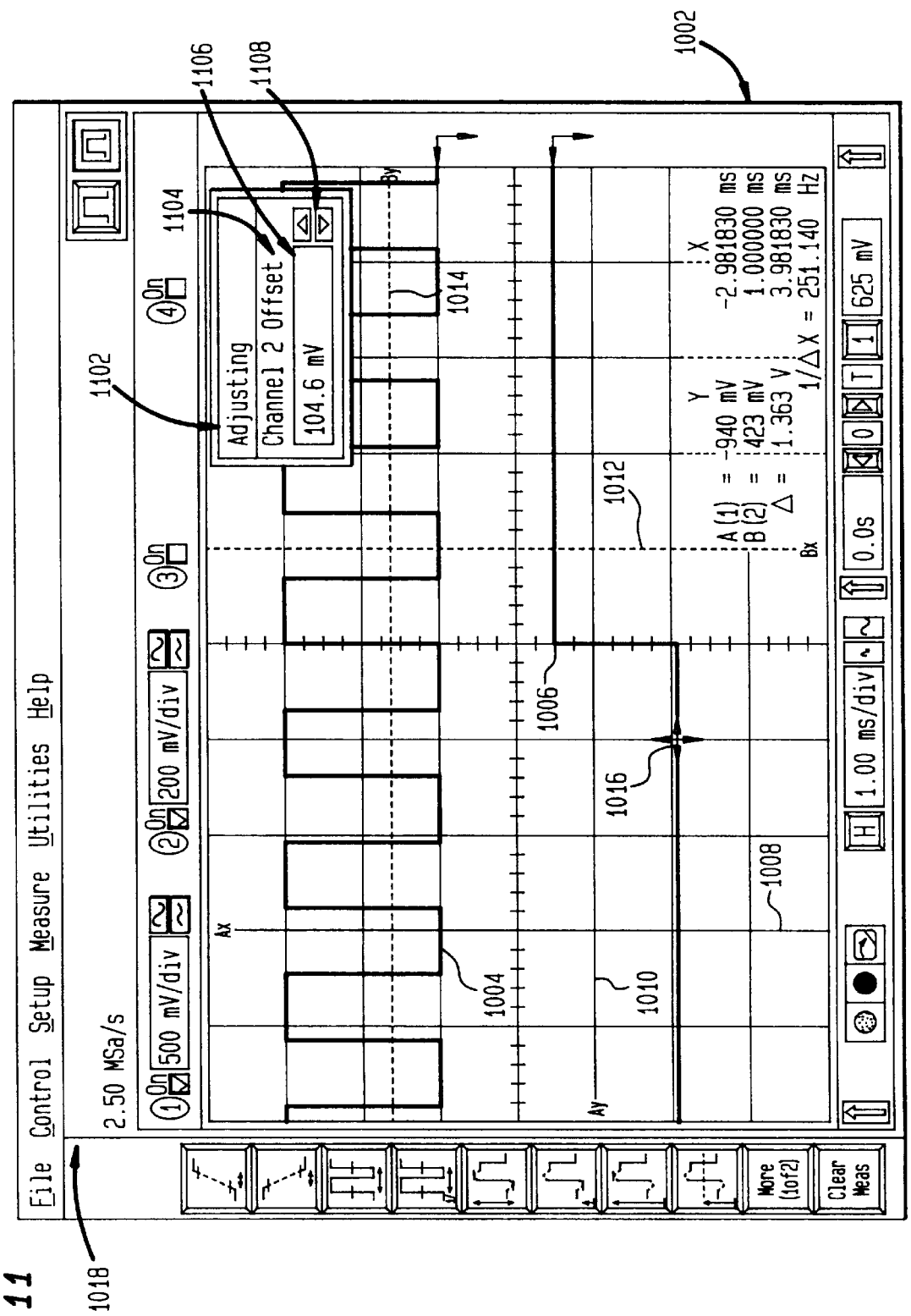
FIG. 11 is an illustration of the exemplary graphical user interface illustrated in FIG. 10 after the user has moved the selected waveform along the vertical axis causing the adjusting dialog box to appear on the waveform display region of the graphical user interface to show the current offset of the selected waveform display element.

FIG. 11 is an illustration of the exemplary waveform display 1002 illustrated in FIG. 10 after the user has moved the channel 2 waveform along the vertical axis. Here, the user has moved the channel 2 waveform 1006 downward in the vertical direction. As shown in FIG. 11, this is the only display element which has been adjusted in response to the movement of the cursor. An adjustment dialog box 1102 having an identification 1104 identifying "Channel 2" as the selected display element and "Offset" as an indication that Channel 2 waveform 1010 is being moved vertically. The position status indicator 1106 identifies the channel 2 waveform 1006 as being located at the 104.6 mV offset. Spin buttons 1108 are provided to enable the user to further adjust the waveform 1006, either left or right along the horizontal axis. In this case the zero button may also be present.

Figure 12:
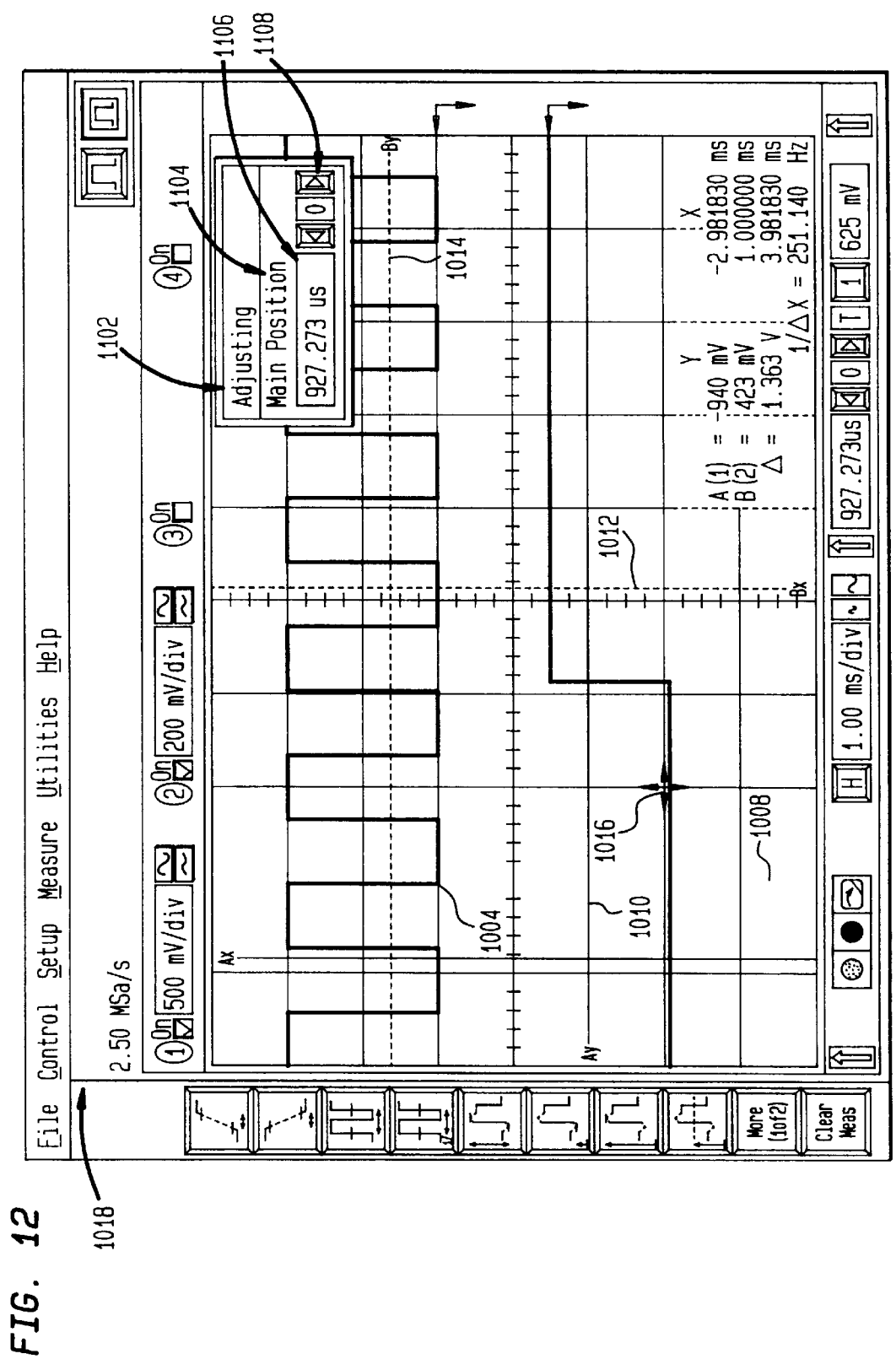
FIG. 12 is an illustration of the exemplary graphical user interface illustrated in FIG. 10 after the user has moved the selected waveform display element along the horizontal axis causing the adjusting dialog box to appear on the waveform display region of the graphical user interface to show the current offset of the waveform display element.

FIG. 12 is an illustration of the exemplary waveform illustrated in FIG. 10 after the user has moved the channel 2 waveform along the horizontal axis. Here, the user has moved the channel 2 waveform 1006 leftward in the horizontal direction. As shown in FIG. 12, all of the display elements have been adjusted in response to the movement of the cursor since the waveforms are linked in the horizontal axis due to the single timebase. An adjustment dialog box 1102 having an identification 1104 identifying "Main Position" to indicated that all of the display elements are being moved horizontally. The position status indicator 1106 identifies the marker 2 waveform 1006 as being located at the 927.273 microsecond offset. Spin buttons 1202 are provided to enable the user to further adjust the waveform 1006, either up or down, along the vertical axis.

This application is a continuation application of commonly owned application Ser. No. 08/863,994 entitled "SYSTEM AND METHOD FOR GRAPHICALLY MANIPULATING DISPLAY ELEMENTS IN A SIGNAL MEASUREMENT SYSTEM," filed May 27, 1997 and naming as inventor Jay A. Alexander, hereby incorporated by reference herein in its entirety.

While various embodiments of the present invention have been described above, it should be understood that they have been presented by way of example only, and not limitation. For example. As noted, the display elements are preferably adjusted in a direction which is parallel either of the two coordinate axes. However, as one skilled in the art would find apparent, in alternative embodiment, the position of the display elements may be adjusted in direction other than those parallel with the coordinate axes. It was noted above, that when there was more than one permissible adjustment direction the desired direction was based upon the dominant direction of the initial cursor movement. However, in alternative embodiments, selection buttons on the graphical user interface may be provided for the user to preselect the desired direction from the permissible adjustment directions. Thus, the breadth and scope of the present invention should not be limited by any of the above-described exemplary embodiments, but should be defined only in accordance with the following claims and their equivalents.

What is claimed is:

1. A display element manipulation system, for use in a computer-based system having a display device, constructed and arranged to enable a user to graphically reposition a selected positionable display element rendered on the display device from an original display location to a new display location, the selected display element being one of a plurality of display element types, wherein said display element manipulation system is constructed and arranged to determine at least one permissible adjustment direction in which the selected display element may be graphically repositioned, said at least one permissible adjustment direction based upon said display element type and a current operational mode of the computer-based system, and wherein said new display location is determined based upon a distance between said original display location and a current cursor display location and said at least one permissible adjustment direction.

2. A display element manipulation system, for use in a computer-based system having a display device, comprising:

a display element selector constructed and arranged to determine, for a user-selected positionable display element, at least one permissible adjustment direction based upon characteristics of said selected display element; and a display element position determinator constructed and arranged to determine an adjustment command representing, for said selected display element, a motion vector between an original display location and a new display location of said selected display element on the display device, said motion vector defined by an adjustment direction and an adjustment distance.

3. The system of claim 2, wherein said adjustment direction is a vector sum of one or more of said at least one permissible adjustment direction that is a dominant vector component of a vector connecting said original display location and a current cursor display location on the display device.

4. The system of claim 2, wherein said display element selector comprises:

a hit-tester constructed and arranged to identify an arbitrary display element of a plurality of display elements rendered on the display device that is nearest to said current cursor display location as said selected display element, wherein said arbitrary display element is less than a predetermined maximum distance from said current cursor display location.

5. The system of claim 4, wherein said display element selector further comprises:

a validator constructed and arranged to determine said at least one permissible adjustment direction.

6. The system of claim 5, wherein said hit-tester determines whether the user has selected a current cursor display location when the cursor dwells at that display location for a predetermined period of time.

7. The system of claim 5, wherein said at least one permissible adjustment direction includes one or more directions that are not parallel to coordinate axes on the display device.

8. The system of claim 4, wherein said display element selector further comprises:

a manipulation display controller constructed and arranged to cause to be displayed one or more display indications of said at least one permissible adjustment direction.

9. The system of claim 8, wherein said at least one permissible adjustment direction consists of one or more directions parallel to coordinate axes on the display device.

10. The system of claim 8, wherein said indications comprise altering a shape of the cursor rendered on the display device.

11. The system of claim 8, wherein said one or more display indications comprises:

textual instructions identifying said at least one permissible adjustment direction.

12. The system of claim 2, wherein the computer-based system is operationally incorporated into a signal measurement system.

13. The system of claim 2, wherein said signal measurement system is a digital oscilloscope.

14. The system of claim 2, wherein said display element position determinator comprises:

a motion vector determinator that determines said motion vector in accordance with said at least one permissible adjustment direction and a current cursor display location;

a waveform analyzer controller that generates said adjustment command based upon said selected display element and said motion vector.

15. The system of claim 14, wherein said display element position determinator further comprises:

an adjustment display controller that generates adjustment dialog boxes on the display device for said selected display element.

16. A digital oscilloscope comprising:

a display device; and a display element manipulation system constructed and arranged to enable a user to graphically manipulate a selected positionable display element rendered on said display device, including:

a display element selector configured to determine one or more permissible adjustment directions in which a selected positionable display element may be repositioned; and a display element position determinator configured to determine an adjustment command representing, for said selected display element, a motion vector defined by an adjustment direction and an adjustment position, said motion vector based upon a type of display element selected.

17. The digital oscilloscope of claim 16, wherein said display element selector comprises:

a hit-tester constructed and arranged to identify a display element rendered at a display location nearest a current cursor display location as said selected display element; and a validator constructed and arranged to determine said at least one permissible adjustment direction of said selected display element based upon a type of selected display element.

18. The oscilloscope of claim 16, wherein said display element selector causes one or more indications of said permissible adjustment directions to be rendered on the display device.

19. The oscilloscope of claim 18, wherein said display element position determinator causes one or more adjustment dialog boxes to be rendered on the display device for said selected display element.

20. The oscilloscope of claim 16, wherein said display element position determinator comprises:

a motion vector determinator that determines said motion vector, wherein said adjustment direction is one of said one or more permissible adjustment directions and is determined by a current cursor display location relative to said original display location of said selected display element, and wherein said adjustment position is determined by said current cursor display location relative to said at least one permissible adjustment direction.

21. A computer-based system comprising:
a display device; and
a display element manipulation system constructed and arranged to enable a user to graphically manipulate a selected positionable display element rendered on said display device, including:
 a display element selector configured to determine one or more permissible adjustment directions in which a selected positionable display element may be repositioned; and
 a display element position determinator configured to determine an adjustment command representing, for said selected display element, a motion vector defined by an adjustment direction and an adjustment position, said motion vector based upon a type of display element selected.

22. The computer-based system of claim 21, wherein said display element selector comprises:
a hit-tester constructed and arranged to identify a display element rendered at a display location nearest a current cursor display location as said selected display element; and
a validator constructed and arranged to determine said at least one permissible adjustment direction of said selected display element based upon a type of selected display element.

23. The computer-based system of claim 21,
wherein said display element selector causes one or more indications of said permissible adjustment directions to be rendered on the display device.

24. The computer-based system of claim 23,
wherein said display element position determinator causes one or more adjustment dialog boxes to be rendered on the display device for said selected display element.

25. The computer-based system of claim 21, wherein said display element position determinator comprises:
a motion vector determinator that determines said motion vector, wherein said adjustment direction is one of said one or more permissible adjustment directions and is determined by a current cursor display location relative to said original display location of said selected display element, and wherein said adjustment position is determined by said current cursor display location relative to said at least one permissible adjustment direction.

26. A method for graphically manipulating display elements on a waveform display in a signal measuring system operatively coupled to a display device, comprising the steps of:
(a) identifying a graphically-selected display element;
(b) determining one or more permissible adjustment directions in which said selected display element may be moved, said at least one permissible adjustment direction based upon a type of display element and a current mode of operation of the signal measurement system;
(c) determining a current cursor display location on the display device;
(d) generating a motion vector based on a relative distance and a direction between said current cursor display location and an original display location of said selected display element, said motion vector having a direction limited to a vector sum of one or more of said at least one permissible adjustment direction; and
(e) determining a new display location of said display element defined by said original display location and said motion vector.

27. The method of claim 26, wherein said step (b) comprises the step of:
(1) causing to be presented on the display device an indication of said at least one permissible adjustment direction.

28. The method of claim 26, further comprising the step of:
(f) before said step (a), detecting the cursor dwelling near said selected display element on said display device.

29. The method of claim 26, wherein said step (d) comprises the steps of:
(1) determining a direction of said motion vector; and
(2) determining a magnitude of said motion vector.

30. The method of claim 29, wherein said step (d) further comprises the steps of:
(3) determining a dominant direction parallel to one coordinate axis when said selected display element is movable along both coordinate axes of the display device;
(4) setting said direction of said motion vector to said dominant direction when said selected display element is movable along both coordinate axes; and
(5) setting said direction of said motion vector to said allowable direction when said selected display element is movable along one coordinate axis.

31. The method of claim 30, wherein said step (d)(2) comprises the steps of:
a) obtaining a time and a voltage for an original cursor position;
b) obtaining a time and a voltage for a current cursor position;
c) determining a time and voltage difference between said original and current cursor display locations when said motion vector is to indicate a relative motion of said display element;
d) setting said magnitude of said motion vector to either said time difference and said voltage difference associated with said direction of said motion vector when said motion vector is to indicate a relative motion of said display element; and
e) setting said magnitude of said motion vector either said time value or said voltage value of said current cursor position when said motion vector is to indicate an absolute location of said display element.

32. A method for graphically manipulating display elements rendered on a display device operatively coupled to a computer-based system, comprising the steps of:
(a) identifying a graphically-selected display element;
(b) determining one or more permissible adjustment directions in which said selected display element may be moved, said at least one permissible adjustment direction based upon a type of display element and a current mode of operation of the computer-based system;
(c) determining a current cursor display location on the display device;
(d) generating a motion vector based on a relative distance and a direction between said current cursor display location and an original display location of said selected display element, said motion vector having a direction limited to a vector sum of one or more of said at least one permissible adjustment direction; and (e) determining a new display location of said display element defined by said original display location and said motion vector.

33. The method of claim 32, wherein said step (b) comprises the step of:

(1) causing to be presented on the display device an indication of said at least one permissible adjustment direction.

34. A display element manipulation system for use in a computer-based system having a graphical user interface, the display element manipulation system providing a user with the ability to graphically reposition an entire selected positionable display element presented on the graphical user interface such that the display element, after being repositioned, is substantially identical, except for its location, to the display element before being repositioned, said display element manipulation system comprising a display element selector configured to determine one or more permissible adjustment directions for a selected positionable display element based upon a type of selected display element and a current operational mode of the computer-based system.

35. A computer program product for, comprising:

a computer readable medium having computer program instructions stored thereon, wherein the computer program instructions, when executed by a processor, provide a display element manipulation system that enables a user to graphically reposition an entire selected positionable display element rendered on a graphical user interface such that the display element, after being repositioned, is substantially identical, except for its location, to the display element before being repositioned, said display element manipulation system comprising a display element selector configured to determine one or more permissible adjustment directions for a selected positionable display element based upon a type of selected display element and a current operational mode of a computer-based system operatively coupled to the display device.

36. A computer program product for graphically manipulating display elements on a waveform display in a signal measuring system having a graphical user interface, comprising:

(a) computer readable medium;

computer program instructions stored on the computer readable medium such that, when executed by a computer, the computer performs a process comprising:

(a) identifying a graphically-selected display element;

(b) determining one or more permissible adjustment directions in which said selected display element may be moved, said at least one permissible adjustment direction based upon a type of display element and a current mode of operation of the signal measurement system;

(c) determining a current cursor display location on the display device;

(d) generating a motion vector based on a relative distance and a direction between said current cursor display location and an original display location of said selected display element, said motion vector having a direction limited to a vector sum of one or more of said at least one permissible adjustment direction; and (e) determining a new display location of said display element defined by said original display location and said motion vector.

37. The computer program product of claim 36, wherein said (b) comprises:

(1) causing to be presented on the display device an indication of said at least one permissible adjustment direction.

38. The computer program product of claim 36, further comprising:

(f) before said step (a), detecting the cursor dwelling near said selected display element on said display device.

39. The computer program product of claim 36, wherein (d) comprises:

(1) determining a direction of said motion vector; and (2) determining a magnitude of said motion vector.

40. The computer program product of claim 39, wherein (d) further comprises:

(3) determining a dominant direction parallel to one coordinate axis when said selected display element is movable along both coordinate axes of the display device;

(4) setting said direction of said motion vector to said dominant direction when said selected display element is movable along both coordinate axes; and (5) setting said direction of said motion vector to said allowable direction when said selected display element is movable along one coordinate axis.

* * * * *